United States Patent
Confalonieri et al.

(10) Patent No.: US 8,014,112 B2
(45) Date of Patent: Sep. 6, 2011

(54) INTEGRATED CIRCUIT WITH DEVICE FOR PROTECTION AGAINST ELECTROSTATIC DISCHARGES

(75) Inventors: Pierangelo Confalonieri, Caponago (IT); Riccardo Martignone, Carnate (IT); Sergio Pernici, Bergamo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 634 days.

(21) Appl. No.: 12/132,352

(22) Filed: Jun. 3, 2008

(65) Prior Publication Data

US 2009/0040669 A1 Feb. 12, 2009

(30) Foreign Application Priority Data

Aug. 8, 2007 (EP) .................................. 07425517

(51) Int. Cl.
*H02H 9/00* (2006.01)
(52) U.S. Cl. ........................................................ 361/56
(58) Field of Classification Search ...................... 361/56
See application file for complete search history.

(56) References Cited

U.S. PATENT DOCUMENTS

| | | | |
|---|---|---|---|
| 6,611,407 B1 | 8/2003 | Chang | |
| 7,692,907 B2 * | 4/2010 | Chen et al. | 361/56 |
| 7,817,386 B2 * | 10/2010 | Ker et al. | 361/56 |
| 2005/0152081 A1 | 7/2005 | Worley | |

OTHER PUBLICATIONS

European Search Report EP 07 42 5517; Dec. 6, 2007.
Yoon Huh, et al. "ESD-Induced Internal Core Device Failure: New Failure Modes in System-on-Chip (SOC) Designs"; Systems-On-Chip for Real-Time Applications; 2005; Proceedings; Fifth International Workshop on Banff, AB, Canada; Jul. 20-24, 2005; Piscataway, NJ; IEEE; Jul. 20, 2005; pp. 47-53.
Voldman "ESD RF Technology and Circuits passage"; ESD RF Technology and Circuits; Wiley; US; Sep. 1, 2007; pp. 100-101.

* cited by examiner

*Primary Examiner* — Stephen W Jackson
(74) *Attorney, Agent, or Firm* — William J. Kubida; Peter J. Meza; Hogan Lovells US LLP

(57) ABSTRACT

An integrated circuit includes a substrate of semiconductive material, a first circuit environment made from the substrate which includes an output terminal and a first pair of power supply terminals for receiving a first power supply voltage applicable between the terminals. The integrated circuit also includes a second circuit environment made from the semiconductor substrate which includes an input terminal electrically coupled to the output terminal and also includes a second pair of power supply terminals for receiving a second power supply voltage applicable between the second pair of terminals of said second pair. The circuit further includes a device providing protection from electrostatic discharges which includes an integrated resistive device coupled between the input and output terminals.

15 Claims, 2 Drawing Sheets

INTEGRATED CIRCUIT WITH DEVICE FOR PROTECTION AGAINST ELECTROSTATIC DISCHARGES

RELATED APPLICATION

The present application claims priority of European Patent Application No. 07425517.5 filed Aug. 8, 2007, which is incorporated herein in its entirety by this reference.

FIELD OF THE INVENTION

The present invention relates to systems for protection of integrated circuits from electrostatic discharges (ESD).

BACKGROUND OF THE INVENTION

In the field of integrated circuit there has for a long time been a need to ensure adequate protection of circuits against electrostatic discharges. In order to satisfy such a requirement for protection special protective structures have been developed, typically consisting of diodes or of MOS transistors. Generally, such structures are active during an electrostatic discharge limiting the consequent impulse of voltage and establishing a low resistance pathway towards the earth of the device.

Different strength tests against electrostatic discharges have also been defined, now considered standard, during which the devices with integrated circuit are subjected to stresses carried out according to certain methods to test their strength against various types of event that produce electrostatic discharges. A device with integrated circuit is considered strong if, subjecting such a device to a strength test, the structure for protecting from electrostatic discharges is not destroyed during the test and if the voltages inside the device thanks to the presence of such protective structures do not exceed values such as to damage the gate oxides of the devices of the integrated circuit.

In strength tests the events that are generally reproduced are those that simulate an unexpected contact of the device with integrated circuit, more specifically its external connection terminals (pins), with an element outside of the device that is at much different voltages to the voltages of the pins of the device.

The two most common strength test methods of a device with integrated circuit against electrostatic discharges are the so-called HBM (Human Body Model) test and the so-called CDM (Charged Device Model) test.

In a HBM test the contact between the device with integrated circuit and a human being is simulated. This is obtained by discharging a test capacity (for example having a value of 100 pF), charged in advance to a certain test voltage, between a pair of connection terminals (pins) of the device, one of which is connected to earth. In the HBM test in series with the capacity a resistance is foreseen that simulates the minimum resistance of the human body (about 1500 Ohm). The test is carried out for any pair of pins of the device.

In a CDM test a rubbing situation is simulated, connecting a capacity, previously charged to a certain test voltage and distinct from the voltage at which the device is charged, to a connection pin of the device without any of the remaining pins of the device being connected to earth. The test is carried out for all of the pins of the device. Unlike the HBM test, in the CDM test there is no resistance in series with the capacity.

In the HBM test, for a device to be considered strong it has to withstand test voltages of the order of 2000-4000 V, whereas in the CDM test resistance to a test voltage of about 500 V is an indication of a good level of strength.

In practice, in the HBM test the ESD protection structures are effective and also the time constants involved during the test are relatively large due to the resistance arranged in series with the condenser charged to the test voltage: this ensures that the different nodes of the integrated circuit have sufficient time available to reach the voltages set by the protection structures.

In CDM tests, on the other hand, there is a certain difficulty in sealing devices with integrated circuit, since the parts thereof in which circuit environments having separate power supply voltages interface are particularly lacking in strength.

The presence in an integrated circuit of two or more circuit environments fed by separate voltages is very frequent. Indeed, the power supplies are separated both when it is necessary to adapt a signal intended to operate with one power supply voltage to a different power supply voltage of a circuit, and to separate the two or more circuit blocks from one another in order to ensure a better distribution of the currents or in order to reduce a noise transfer between such blocks.

The causes of the particular lack of strength in CDM tests of integrated circuits having two or more circuit environments intended to operate with separate power supply voltages are briefly illustrated hereafter.

FIG. 1 schematically represents an example of an integrated circuit 1 including two circuit environments CE_1, CE_2 intended to operate with two separate power supply voltages.

In the example, the first circuit environment CE_1 is intended to be fed by a first power supply voltage applicable between two dedicated power supply terminals, for example corresponding to two connection pads VDD1, GND1.

The second circuit environment CE_2 is intended to be fed by a second power supply voltage, separate from the first power supply voltage, applicable between two dedicated power supply terminals, for example corresponding to two further connection pads VDD2, GND2.

The first circuit environment CE_1 comprises a logic circuit IV1_1, IV1_2 formed from two inverters connected in cascade and each made through a pair of MOS transistors. The logic circuit IV1_1, IV1_2 comprises an input terminal In1 suitable for receiving an input signal and an output terminal Ou1 to provide a corresponding output signal. Between the two power supply terminals VDD1, GND1 of the first circuit environment CE_1 there is a structure P1 for protecting against electrostatic discharges, of the conventional type. The capacity C1 between the two power supply terminals GND1, VDD1 represents an intrinsic capacity the presence of which is due to the process for making the integrated circuit. As is known, such a capacity can also assume high values (of the order of nF) particularly if the integrated circuit occupies a large area of substrate of semiconductive material.

Similarly, the second circuit environment CE_2 comprises a logic circuit IV2_1, IV2_2 formed from two inverters connected in cascade, each comprising a pair of MOS transistors. The logic circuit IV2_1, IV2_2 comprises an input terminal In2 connected to the output terminal Ou1 of the first circuit environment CE_1 and an output terminal Ou2 to provide an output signal. Between the two power supply terminals VDD2, GND2 of the second circuit environment CE_2 there is a structure P2 for protecting against electrostatic discharges, of the conventional type. The capacity C2 between the two power supply terminals VDD2, GND2 also represents an intrinsic capacity the presence of which is due to the process of making the integrated circuit.

Relative to the operation of the circuit 1 during a CDM strength test, presuming that the integrated circuit 1 is completely discharged and that a high voltage (for example 500 V) is applied to the power supply terminal GND1, the Applicant has observed the following.

Analysing the two circuit environments CE_1, CE_2 individually, each of them is substantially strong against electrostatic discharges. For example, in the first circuit environment CE_1 the capacity C1 is able to keep the voltage of the nodes corresponding to VDD1 and GND1 close together. If the voltage of the node GND1, as a result of the rapid application of the test voltage CDM of 500 V, varies rapidly, in an ideal situation the capacity C1 tends to maintain its charge (in the example 0 V) taking the voltage of the node VDD1 to such a test voltage. In a real situation, the node VDD1 shall also encounter the parasite capacity of the other nodes (and of the substrate in particular) and for this reason the voltage of the node VDD1 will tend to differ from the voltage of the node GND1. However, if the difference in voltage becomes significant the protection structure P1 intervenes in order to contain such a difference. Should the intervention times of such a protection structure be long compared to the time constants of the variations as a consequence of the application of the test voltage in the CDM test, the protection may be not very effective. The same thing occurs due to the intrinsic transition for containing the variation in voltage due to the fact that the resistance of the protection structure P1 is not zero. In any case, should the efficiency of protection offered by the protection structure P1 be low, the protection can in any case be intrinsically ensured by the diodes of the drain and source diffusions of the components of the logic circuit. Moreover, overall these operate in parallel with the protection structure P1, improving its efficiency.

Relative to the second circuit environment CE_2, following the application of the test voltage to the first circuit environment CE_1, the Applicant has observed the following.

So that the second circuit environment CE_2 can feel the variation in voltage as a consequence of the application of the test voltage to the node GND1, such a variation must pass through connection pathways consisting of diodes between the first CE_1 and the second CE_2 circuit environment. Such diodes are, for example, back-to-back diodes between the earths, or else those towards the substrate typical of the production technology. The node GND2 has a high capacity towards the substrate, for example of the order of a few hundreds of picofarads, which must be charged through the pathways of back-to-back diodes. The connection pathways are fairly complex and difficult to evaluate, nevertheless since such diodes have finite resistance and the connection pathways are often made through long metallization runs, it has been observed that the connection pathways can reach typical overall resistances of tens of ohms. In this way a significantly different time constant is created compared to the time constant of the variation in voltage of the node GND1 as a consequence of the application of the test voltage. Consequently, the nodes GND2 and VDD2 tend to have a significantly different voltage to that of the node GND1. For this reason, the two MOS of the first inverter INV2_1 have a gate terminal at a voltage correlated to the voltage of the first circuit environment CE_1 and have drain and source terminals at voltages that move with the time constant associated with the node GND2. If a voltage difference is created such as to exceed the sealing characteristics of the gate oxides damage occurs. Clearly, in this case the circuit does not pass the CDM test.

This problem is made worse by the fact that in modern technological processes for producing integrated circuits there is a constant tendency to reduce the gate oxides, for which reason relatively low voltage differences are sufficient to cause the oxides to break.

If the evolution of ESD protection structures is such as to ensure a certain strength of integrated circuits in HBM tests, for the reasons described above this is just as much not the case for CDM tests, particularly when there are many circuit environments intended to operate with separate power supply voltages in the same integrated circuit.

Therefore, there is a need to make an integrated circuit [with high strength against] able to withstand electrostatic discharges and in particular discharges of the type simulated in CDM strength tests.

SUMMARY OF THE INVENTION

An integrated circuit of the present includes a substrate of semiconductive material, a first circuit environment made from the substrate which includes an output terminal and a first pair of power supply terminals for receiving a first power supply voltage applicable between the terminals. The integrated circuit also includes a second circuit environment made from the semiconductor substrate which includes an input terminal electrically coupled to the output terminal and also includes a second pair of power supply terminals for receiving a second power supply voltage applicable between the second pair of terminals of said second pair. The circuit further includes a device providing protection from electrostatic discharges which includes an integrated resistive device coupled between the input and output terminals. Preferred embodiments of the present invention include features as defined in the dependent claims.

BRIEF DESCRIPTION OF THE DRAWINGS

Further characteristics and advantages of the invention shall be come clearer from the following detailed description of preferred embodiments thereof, given for indicating purposes and therefore in no way limiting in relation to the attached figures, in which.

In the figures, identical or similar elements are indicated with the same reference numerals.

DETAILED DESCRIPTION

Figure 2:
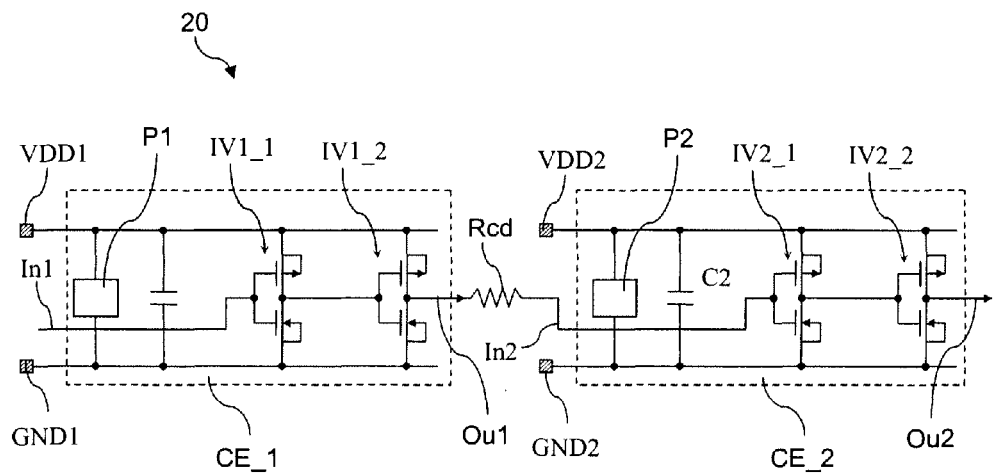
FIG. 2 shows a circuit diagram of an example of an integrated circuit in accordance with a first embodiment of the present invention.

FIG. 2 represents the circuit diagram of a possible example of an integrated circuit 20 in accordance with the present invention. Such an integrated circuit 20 is made from a substrate of semiconductive material, like for example silicon.

It should be pointed out that the particular example of an integrated circuit 20 described, only in order to make the description of the invention clear, has a relatively simple architecture and that in a real situation such an integrated circuit 20 can also include a few tens or hundreds of thousands of electronic components, like for example logic gates.

The integrated circuit 20 comprises at least two circuit environments CE_1, CE_2 made from said substrate and intended to operate with separate two power supply voltages. In the described example there are only two such circuit environments CE_1, CE_2, in a real situation such environments could be more numerous.

In the example, a first circuit environment CE_1 is intended to be fed by a first power supply voltage applicable between two dedicated power supply terminals for example, not limitingly, corresponding to two connection pads VDD1, GND1.

The second circuit environment CE_2 is intended to be fed by a second power supply voltage, separate from the first power supply voltage, but not necessarily having a different value to it, applicable between two dedicated power supply terminals for example, not limitingly, corresponding to two further connection pads VDD2, GND2.

The first circuit environment CE_1 comprises a logic circuit IV1_1, IV1_2 including two inverters connected in cascade and each made through a pair of transistors MOS. The logic circuit IV1_1, IV1_2 comprises an input terminal In1 suitable for receiving an input signal and an output terminal Ou1 to provide a corresponding output signal. Between the two power supply terminals VDD1, GND1 of the first circuit environment CE_1 there is preferably a structure P1 for protecting against electrostatic discharges. Such a protection structure P1 can for example be made through diodes or through MOS in accordance with methods known to the man skilled in the art and that shall not therefore be described any further.

In the first circuit environment CE_1, the capacity C1 between the two power supply terminals GND1, VDD1 represents an intrinsic capacity the presence of which is due to the process for making the integrated circuit 20. As is known, such a capacity can also assume high values (of the order of nF) particularly if the integrated circuit 20 occupies a large area of substrate of semiconductive material.

Similarly, the second circuit environment CE_2 comprises a logic circuit IV2_1, IV2_2 including two inverters connected in cascade, each comprising a pair of MOS transistors. The logic circuit IV2_1, IV2_2 comprises an input terminal In2 electrically coupled with the output terminal Ou1 of the first circuit environment and an output terminal Ou2 to provide an output signal. Between the two power supply terminals VDD2, GND2 of the second circuit environment CE_2 there is preferably a structure P2 for protecting from electrostatic discharges, for example of the type already described with reference to the protection structure P1.

In the second circuit environment CE_2 the capacity C2 between the two power supply terminals VDD2, GND2 represents an intrinsic capacity the presence of which is due to the process for making the integrated circuit 20.

In the example, the second circuit environment CE_2 has an output terminal Ou2 to provide an output signal.

Integrated circuit 20 also includes a device for protection against electrostatic discharges. Advantageously, such a protection device includes at least one integrated resistive element Rcd connected between the output terminal Ou1 of the first circuit environment CE_1 and the input terminal In2 of the second circuit environment CE_2. Hereinafter in the present description reference shall be made, without for this reason introducing any limitation, to the particularly preferred embodiment in which the resistive element Rcd is in the form of a resistor Rcd integrated and directly connected between the output terminal Ou1 of the first circuit environment CE_1 and the input terminal In2 of the second circuit environment CE_2.

For example, the resistor Rcd is an integrated resistor made by diffusion or a resistor made from polysilicon.

Advantageously, the resistance value of such a resistor Rcd is selected so that together with the capacity associated with the input terminal In2 of the second circuit environment CE_2, it is such as to increase (with respect to a time constant that would be observed in the absence of such a resistor) the characteristic time constant of possible variations in voltage of the input terminal In2 caused by the application to the first circuit environment CE_1 of electrostatic discharge voltages of the type simulated in a Charged Device Model strength test. Advantageously, this ensures that during an electrostatic discharge the second circuit environment CE_2 is forced to follow rapid variations in voltage of the first circuit environment CE_1 with a certain delay that depends upon such a time constant.

For example, the resistance value of the resistor Rcd is selected so that the time constant that regulates such a delay has a value of the order of 1 ns.

Preferably, the resistance value of the resistor Rcd is roughly within the range 0.5-10 kOhm, and more preferably within the range 1-5 kOhm.

Figure 1:
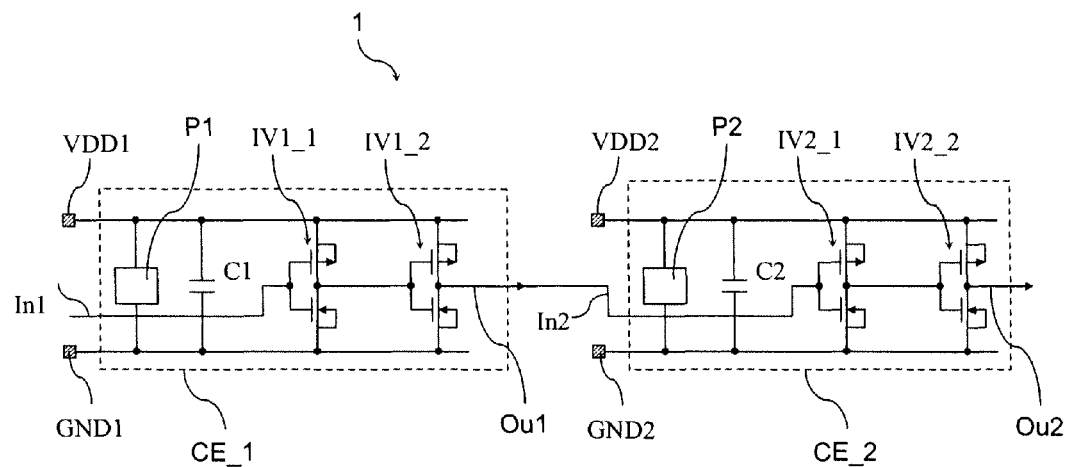
FIG. 1 shows a circuit diagram of an integrated circuit of the state of the art.

In the case in which, like in the example described in FIG. 1, the input In2 of the second circuit environment represents a gate terminal of an MOS, it is possible to use a resistor Rcd having a resistance that is as high as one wishes.

Figure 3:
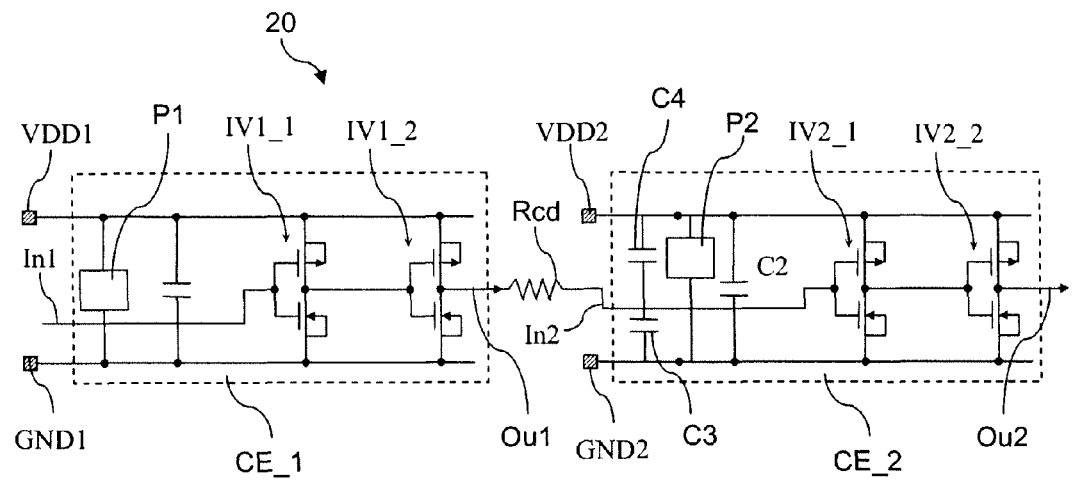
FIG. 3 shows a circuit diagram of an example of an integrated circuit in accordance with a second embodiment of the present invention.

With reference to FIG. 3, on the other hand, in the case in which the use of a resistor Rcd having a resistance value sufficient to ensure an adequate time constant for the circumstances is problematic, it is possible to foresee a protection device comprising, in addition to the resistor Rcd, at least one integrated condenser C3, C4 having a terminal connected to the input terminal of the second circuit environment CE2 and the other terminal connected to one of the power supply terminals VDD2, GND2 of the second circuit environment CE_2.

Figure 4:
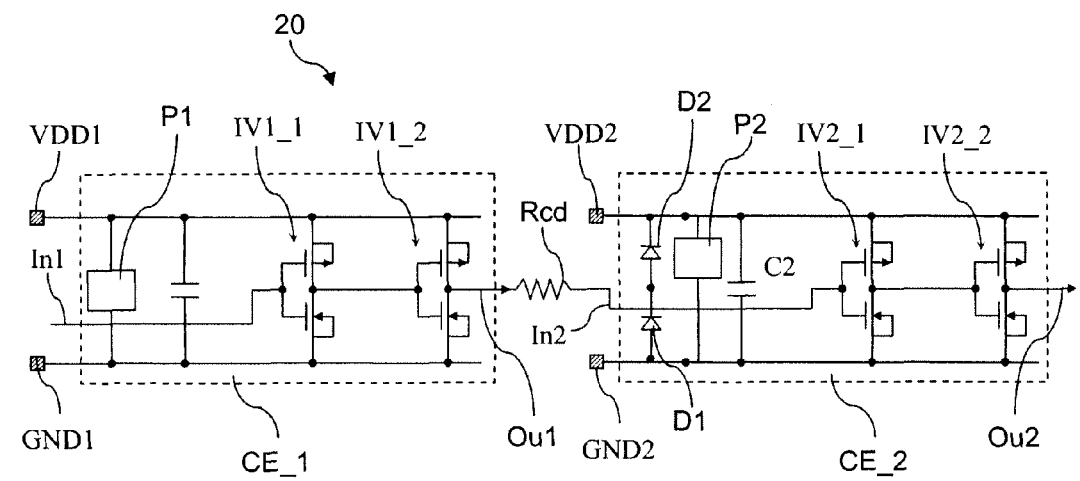
FIG. 4 shows a circuit diagram of an example of an integrated circuit in accordance with a third embodiment of the present invention.

FIG. 4 shows a further embodiment in which the protection device comprises, in addition to the resistive element Rcd, at least one integrated diode D1, D2 inversely polarised with respect to the power supply applicable to the second circuit environment CE_2 and connected between the input terminal In2 of the second circuit environment CE_2 and one of the power supply terminals VDD2, GND2 of the second circuit environment CE_2.

Preferably, as represented in the figures, there are two diodes D1, D2, each connected between the input terminal In2 and a respective power supply terminal of the pair GND2, VDD2.

The use of one or more diodes D1, D2 in addition to the resistive element Rcd further contributes to keeping the input terminal In2 of the second circuit environment CE_2 (which in this specific example represents a gate terminal) linked to the voltages of the power supply terminals GND2, VDD2 of the second circuit environment CE_2, and therefore, in the specific example represented in FIG. 4, to the source and drain terminals of the MOS of the inverter IV2_1.

In a further embodiment not represented in the figures, the protection device of the integrated circuit 20 of FIG. 4 could advantageously include at least one capacity connected between the output terminal Ou1 of the first circuit environment CE_1 and one of the power supply terminals VDD1, GND1 of such an environment. Preferably, there are two capacities, each connected between the output terminal Ou1 and a respective power supply terminal of the pair GND1, VDD1. The addition of at least one capacity to the output of the first circuit environment CE_1 in the way described above ensures greater strength of the output MOS of the first circuit environment CE_1 in the case in which the electrostatic discharge voltage is applied to the second circuit environment CE_2 instead of to the first CE_1. Indeed, such a capacity in combination with the resistor Rcd increases the delay with which the output of the first circuit environment CE_1 is forced to follow the second circuit environment CE_2.

Experimental tests and simulations have demonstrated that an integrated circuit with a protection device in accordance with the present invention has a particular ability to withstand electrostatic discharges of the type simulated in CDM strength tests.

Of course, a man skilled in the art can bring further modifications and variants to the integrated circuit described above, in order to satisfy contingent and specific requirements, all of which are in any case covered by the scope of protection of the invention, as defined by the following claims.

The invention claimed is:

1. An integrated circuit comprising:
a substrate of semiconductive material;
a first circuit environment made from said substrate, comprising a first pair of power supply terminals to receive a first power supply voltage applicable between said terminals and also comprising an output terminal;
a second circuit environment made from said substrate, comprising a second pair of power supply terminals, distinct from said first pair of terminals, to receive a second power supply voltage applicable between terminals of said second pair and also comprising an input terminal electrically coupled with said output terminal; and
a resistive device operatively connected between said input and output terminals for protection against electrostatic discharges,
wherein said resistive device has a resistance, the value of which is selected so as to increase a time constant of a variation in voltage of said input terminal due to the application to the first circuit environment of an electrostatic discharge voltage of the type simulated in a strength test of the Charged Device Model type.

2. The integrated circuit according to claim 1, wherein said resistance value is selected so that said time constant has a value in the order of 1 ns.

3. An integrated circuit comprising:
a substrate of semiconductive material;
a first circuit environment made from said substrate, comprising a first pair of power supply terminals to receive a first power supply voltage applicable between said terminals and also comprising an output terminal;
a second circuit environment made from said substrate, comprising a second pair of power supply terminals, distinct from said first pair of terminals, to receive a second power supply voltage applicable between terminals of said second pair and also comprising an input terminal electrically coupled with said output terminal; and
a resistive device operatively connected between said input and output terminals for protection against electrostatic discharges,
wherein said resistive device comprises a resistor connected in series between said output terminal and said input terminal.

4. The integrated circuit according to claim 3, wherein said resistor has a resistance value of approximately from 0.5-10 kOhm.

5. The integrated circuit according to claim 3, wherein said resistor is an integrated device made by diffusion or from polysilicon.

6. An integrated circuit comprising:
a substrate of semiconductive material;
a first circuit environment made from said substrate, comprising a first pair of power supply terminals to receive a first power supply voltage applicable between said terminals and also comprising an output terminal;
a second circuit environment made from said substrate, comprising a second pair of power supply terminals, distinct from said first pair of terminals, to receive a second power supply voltage applicable between terminals of said second pair and also comprising an input terminal electrically coupled with said output terminal; and
a resistive device operatively connected between said input and output terminals for protection against electrostatic discharges,
wherein at least one of the first and second circuit environments also comprises a structure for protection from electrostatic discharges connected in parallel between said pair of power supply terminals.

7. An integrated circuit comprising:
a substrate of semiconductive material;
a first circuit environment made from said substrate, comprising a first pair of power supply terminals to receive a first power supply voltage applicable between said terminals and also comprising an output terminal;
a second circuit environment made from said substrate, comprising a second pair of power supply terminals, distinct from said first pair of terminals, to receive a second power supply voltage applicable between terminals of said second pair and also comprising an input terminal electrically coupled with said output terminal; and
a resistive device operatively connected between said input and output terminals for protection against electrostatic discharges,
wherein said resistive device also includes a first integrated condenser connected between said input terminal and one of said terminals of said second pair of power supply terminals.

8. The integrated circuit according to claim 7, wherein said resistive device also includes a second integrated condenser connected between said input terminal and the other of said terminals of said second pair of power supply terminals.

9. An integrated circuit comprising:
a substrate of semiconductive material;
a first circuit environment made from said substrate, comprising a first pair of power supply terminals to receive a first power supply voltage applicable between said terminals and also comprising an output terminal;
a second circuit environment made from said substrate, comprising a second pair of power supply terminals, distinct from said first pair of terminals, to receive a second power supply voltage applicable between terminals of said second pair and also comprising an input terminal electrically coupled with said output terminal; and
a resistive device operatively connected between said input and output terminals for protection against electrostatic discharges,
wherein said resistive device also includes a first integrated diode connected between said input terminal and one of said terminals of said second pair of power supply terminals in an inverse polarisation configuration with respect to said second power supply voltage.

10. The integrated circuit according to claim 9, wherein said resistive device also includes a second integrated diode connected between said input terminal and the other of said terminals of said second pair of power supply terminals in an inverse polarisation configuration with respect to said second power supply voltage.

11. The integrated circuit according to claim 9, wherein said resistive device also includes at least one integrated condenser connected between said output terminal and at least one of said terminals of said first pair of power supply terminals.

12. The integrated circuit according to claim 10, wherein said resistive device also includes at least one integrated condenser connected between said output terminal and at least one of said terminals of said first pair of power supply terminals.

13. The integrated circuit according to claim 4, wherein said resistor is an integrated device made by diffusion or from polysilicon.

14. The integrated circuit according to claim 1, wherein said resistive device also includes a first integrated diode connected between said input terminal and one of said terminals of said second pair of power supply terminals in an inverse polarisation configuration with respect to said second power supply voltage.

15. The integrated circuit according to claim 7, wherein said resistive device also includes a first integrated diode connected between said input terminal and one of said terminals of said second pair of power supply terminals in an inverse polarisation configuration with respect to said second power supply voltage.

* * * * *